United States Patent
Miyazaki et al.

(10) Patent No.: US 11,888,409 B2
(45) Date of Patent: Jan. 30, 2024

(54) POWER CONVERSION DEVICE WITH EFFECTIVE VEHICLE SPACE UTILIZATION

(71) Applicant: DENSO CORPORATION, Kariya (JP)

(72) Inventors: Masaru Miyazaki, Kariya (JP); Hideaki Tachibana, Kariya (JP)

(73) Assignee: DENSO CORPORATION, Kariya (JP)

( * ) Notice: Subject to any disclaimer, the term of this patent is extended or adjusted under 35 U.S.C. 154(b) by 335 days.

(21) Appl. No.: 17/466,123

(22) Filed: Sep. 3, 2021

(65) Prior Publication Data

US 2021/0399647 A1    Dec. 23, 2021

Related U.S. Application Data

(63) Continuation of application No. PCT/JP2020/013595, filed on Mar. 26, 2020.

(30) Foreign Application Priority Data

Apr. 5, 2019    (JP) ................... 2019-073011

(51) Int. Cl.
*H02M 7/00*    (2006.01)
*B60L 50/51*    (2019.01)
*H02M 7/797*   (2006.01)
*B60L 15/00*   (2006.01)

(52) U.S. Cl.
CPC ........... *H02M 7/003* (2013.01); *B60L 15/007* (2013.01); *B60L 50/51* (2019.02); *H02M 7/797* (2013.01)

(58) Field of Classification Search
CPC ...... H02M 7/003; H02M 7/797; H02M 1/007; H02M 3/158; B60L 15/007; B60L 50/51; Y02T 10/64; Y02T 10/70; H05K 7/20927; H05K 7/14322; H05K 7/14329
See application file for complete search history.

(56) References Cited

U.S. PATENT DOCUMENTS

| | | | | |
|---|---|---|---|---|
| 2008/0316710 | A1* | 12/2008 | Seto | ........................ H02M 7/003 361/704 |
| 2011/0198121 | A1* | 8/2011 | Matsumoto | ........ H05K 7/14329 174/549 |
| 2012/0300521 | A1* | 11/2012 | Hida | ................... H05K 7/20927 363/131 |
| 2013/0070502 | A1* | 3/2013 | Suzuki | .................. H02M 7/003 363/131 |

(Continued)

FOREIGN PATENT DOCUMENTS

JP    2015-213406 A    11/2015

*Primary Examiner* — Kyle J Moody
*Assistant Examiner* — Jye-June Lee
(74) *Attorney, Agent, or Firm* — Oliff PLC

(57) ABSTRACT

A power conversion device includes a semiconductor unit, a terminal unit, a capacitor unit, a control board, and a case. The semiconductor unit is arranged at a position facing a plate surface of the control board. The terminal unit and the capacitor unit are arranged side by side in a x direction along the plate surface of the control board on the opposite side of the control board with respect to the semiconductor unit. At least a part of the capacitor unit or the terminal unit is located outside a first end of the semiconductor unit in the x direction. A first recess in which a first electrical wiring is arranged is formed in a portion of the case facing the first end so as to be recessed inside the case.

5 Claims, 4 Drawing Sheets

(56) References Cited

U.S. PATENT DOCUMENTS

| | | | |
|---|---|---|---|
| 2014/0092663 A1* | 4/2014 | Shimizu | H02M 7/003 363/141 |
| 2014/0284765 A1* | 9/2014 | Kiuchi | H02M 7/003 257/532 |
| 2018/0358903 A1* | 12/2018 | Takahashi | H02M 7/003 |
| 2019/0334440 A1* | 10/2019 | Miyazaki | H05K 7/20927 |
| 2020/0091833 A1* | 3/2020 | Sano | H02M 7/003 |
| 2022/0337167 A1* | 10/2022 | Mizuno | H02M 7/003 |

* cited by examiner

POWER CONVERSION DEVICE WITH EFFECTIVE VEHICLE SPACE UTILIZATION

CROSS REFERENCE TO RELATED APPLICATIONS

This application is a continuation application of International Patent Application No. PCT/JP2020/013595 filed on Mar. 26, 2020, which designated the U.S. and based on and claims the benefits of priority of Japanese Patent Application No. 2019-073011 filed on Apr. 5, 2019. The entire disclosure of all of the above applications is incorporated herein by reference.

TECHNICAL FIELD

The disclosure in this specification relates to a power conversion device that converts electric power supplied to an in-vehicle motor.

BACKGROUND

A power conversion device such as a converter and an inverter includes components such as a laminated unit, a terminal unit, a capacitor element, and a control board, and a case for accommodating these components.

SUMMARY

An object of the present disclosure is to provide a power conversion device that promotes effective utilization of an in-vehicle space.

In one aspect of the present disclosure, a power conversion device that converts the power supplied to an vehicle-mounted motor by an upper and lower arm circuit includes a semiconductor unit having a semiconductor module in which switching elements of upper and lower arm circuits are resin-sealed, and a cooler configured to cool the semiconductor module, a terminal unit having an output terminal of the semiconductor module, a relay output terminal configured to electrically connect windings of the vehicle-mounted motor, and a terminal block configured to hold the relay output terminal, a capacitor unit having a smoothing capacitor connected in parallel to the upper and lower arm circuits to smooth a voltage pulsation, and a capacitor case accommodating the smoothing capacitor, a control board configured to control an operation of the switching elements, and a case in which the control board, the semiconductor unit, the terminal unit, and the capacitor unit are housed.

The semiconductor unit is arranged at a position facing a plate surface of the control board.

The terminal unit and the capacitor unit are arranged side by side in a direction along the plate surface on the opposite side of the control board with respect to the semiconductor unit.

A direction perpendicular to the plate surface of the control board is referred to as a z direction, a direction in which the terminal unit and the capacitor unit are arranged side by side is referred to as a x direction, and a direction perpendicular to the z direction and the x direction is referred to as a y direction.

Of both ends of the semiconductor unit in the x direction, one end is referred to as a first end and the other end is referred to as a second end.

At least a part of the capacitor unit or the terminal unit is located outside the first end in the x direction.

A recess in which an electrical wiring is arranged is formed in a portion of the case facing the first end so as to be recessed inside the case.

DETAILED DESCRIPTION

Figure 1:
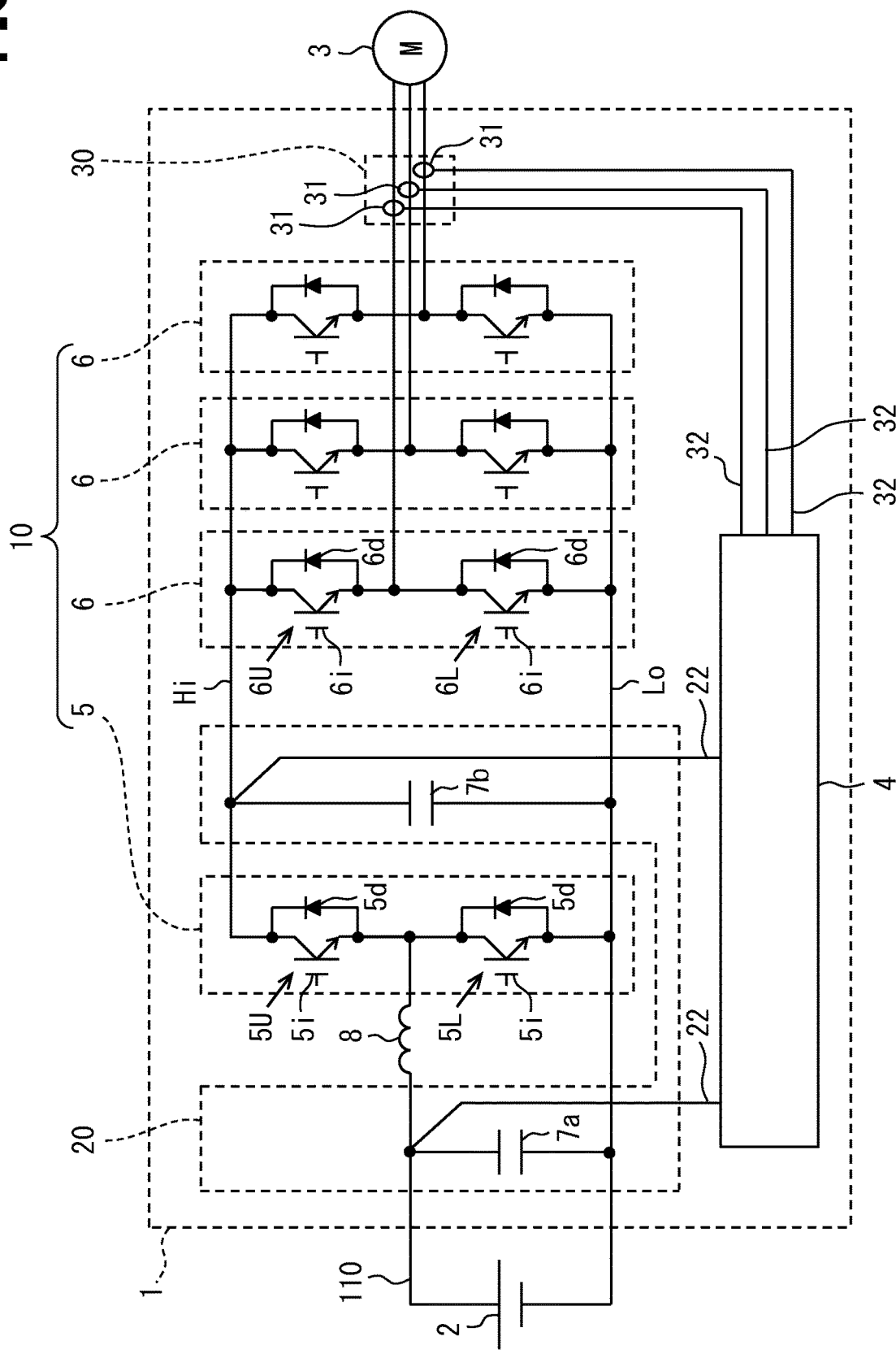
FIG. 1 is a diagram showing a circuit configuration of a power conversion device according to a first embodiment.

In an assumable example, a power conversion device such as a converter and an inverter includes components such as a laminated unit, a terminal unit, a capacitor element, and a control board, and a case for accommodating these components. The laminated unit includes a plurality of stacked power cards and a cooler. A power card is a resin-molded component of a switching element that constitutes an arm or the like.

In the case, the laminated unit, the terminal unit and the capacitor element are arranged below the control board. Further, the laminated unit, the terminal unit, and the capacitor element are arranged side by side in a horizontal direction along a plate surface of the control board.

By the way, it is customary for the conventional case to have a rectangular parallelepiped shape having a flat plate surface. Then, when trying to accommodate various components in a case having such a shape, as described above, arranging them side by side in the horizontal direction is effective in increasing the space factor in the case.

However, an electrical wiring of an external device is connected to an input terminal and an output terminal of the power conversion device. Such electrical wiring is routed along an outer surface of the case. Therefore, it is necessary to secure a mounting space on the vehicle side in which the electrical wiring are added to the power conversion device. Therefore, it is not possible to sufficiently effectively utilize the in-vehicle space including the electrical wiring only by increasing the space factor in the case and reducing the size of the power conversion device.

An object of the present disclosure is to provide a power conversion device that promotes effective utilization of an in-vehicle space.

In one aspect of the present disclosure, a power conversion device that converts the power supplied to an vehicle-mounted motor by an upper and lower arm circuit includes a semiconductor unit having a semiconductor module in which switching elements of upper and lower arm circuits are resin-sealed, and a cooler configured to cool the semiconductor module, a terminal unit having an output terminal of the semiconductor module, a relay output terminal configured to electrically connect windings of the vehicle-mounted motor, and a terminal block configured to hold the relay output terminal, a capacitor unit having a smoothing capacitor connected in parallel to the upper and lower arm circuits to smooth a voltage pulsation, and a capacitor case accommodating the smoothing capacitor, a control board configured to control an operation of the switching elements, and a case in which the control board, the semiconductor unit, the terminal unit, and the capacitor unit are housed.

The semiconductor unit is arranged at a position facing a plate surface of the control board.

The terminal unit and the capacitor unit are arranged side by side in a direction along the plate surface on the opposite side of the control board with respect to the semiconductor unit.

A direction perpendicular to the plate surface of the control board is referred to as a z direction, a direction in which the terminal unit and the capacitor unit are arranged side by side is referred to as a x direction, and a direction perpendicular to the z direction and the x direction is referred to as a y direction.

Of both ends of the semiconductor unit in the x direction, one end is referred to as a first end and the other end is referred to as a second end.

At least a part of the capacitor unit or the terminal unit is located outside the first end in the x direction.

A recess in which an electrical wiring is arranged is formed in a portion of the case facing the first end so as to be recessed inside the case.

According to the above disclosure, the terminal unit and the capacitor unit are arranged on the opposite side of the control board with respect to the semiconductor unit. Then, in the x direction, the first end of the semiconductor unit is located inside the terminal unit or the capacitor unit. Therefore, according to the case in which the recess is formed in the portion facing the first end located inside, a space factor in the case can be increased. Nevertheless, since the electrical wiring is arranged in the recess, the vehicle mounting space in which the electrical wiring is added to the power conversion device can be sufficiently reduced, and effective utilization of in-vehicle space can be promoted.

Multiple embodiments will be described with reference to the drawings. In the following embodiments, functionally or structurally corresponding parts are assigned with the same reference numerals. In the following, a vertical direction when a power conversion device is mounted on a vehicle is referred to as z direction, and one direction orthogonal to the z direction is referred to as x direction. Further, a direction orthogonal to both the z direction and the x direction is referred to as y direction.

FIRST EMBODIMENT

First, a circuit configuration of a power conversion device will be described with reference to FIG. 1.

<Circuit Configuration of Power Conversion Device>

The power conversion device 1 is mounted on a vehicle such as an electric vehicle or a hybrid vehicle. The power conversion device 1 converts a DC voltage supplied from a DC power supply 2 mounted on the vehicle into three-phase AC and outputs it to a three-phase AC type motor 3 (vehicle-mounted motor). The motor 3 functions as a traveling drive source for the vehicle. The power conversion device 1 can also convert an electric power generated by the motor 3 into a direct current and charge the DC power supply 2. The power conversion device 1 is capable of bidirectional power conversion.

The power conversion device 1 includes a control board 4, semiconductor modules 5 and 6, a filter capacitor 7a, a smoothing capacitor 7b, and a reactor 8.

The semiconductor module 5 is a DC-DC converter, and functions as a converter circuit that converts a DC voltage into a DC voltage having a different value. The semiconductor module 5 has an upper arm 5U and a lower arm 5L connected in series with each other. The upper arm 5U and the lower arm 5L are composed of a switching element 5i and a diode 5d. The upper arm 5U and the lower arm 5L are collectively called an upper and lower arm circuit.

The semiconductor module 6 is a DC-AC conversion unit, and functions as an inverter circuit that converts the input DC power into three-phase alternating current having a predetermined frequency and outputs it to the motor 3. This inverter circuit also has a function of converting AC power generated by the motor 3 into DC power. The semiconductor module 6 is connected to each of the three phases of the motor 3. The semiconductor module 6 has an upper arm 6U and a lower arm 6L connected in series with each other. The upper arm 6U and the lower arm 6L are composed of a switching element 6i and a diode 6d. The upper arm 6U and the lower arm 6L are collectively called an upper and lower arm circuit.

In the present embodiment, an n-channel type insulated gate bipolar transistor (IGBT) is adopted as the switching elements 5i and 6i constituting each arm. The collector electrodes of the IGBTs of the upper arms 5U and 6U are connected to a high potential power line Hi. The emitter electrodes of the IGBTs of the lower arms 5L and 6L are connected to a low potential power line Lo. The emitter electrodes of the IGBTs of the upper arms 5U and 6U and the collector electrodes of the IGBTs of the lower arms 5L and 6L are connected to each other.

A filter capacitor 7a is connected between a positive electrode and a negative electrode of the DC power supply 2. The filter capacitor 7a smoothes the direct current input from the DC power supply 2.

The smoothing capacitor 7b is connected between the high potential power line Hi and the low potential power line Lo. The smoothing capacitor 7b is connected in parallel with the semiconductor modules 5 and 6. The smoothing capacitor 7b smoothes the DC current boosted by the converter circuit in the semiconductor module 5. The smoothing capacitor 7b accumulates the charge of the boosted DC voltage.

The reactor 8 boosts the voltage of the DC power supply 2 as the semiconductor module 5 switches.

The control board 4 generates a drive command for operating the switching elements 5i and 6i of the semiconductor modules 5 and 6, and outputs the drive command to a drive circuit unit (driver) (not shown). The control board 4 generates the drive command based on a torque request input from a higher-level ECU (not shown) or signals detected by various sensors. Specifically, the control board 4 outputs a PWM signal as the drive command. The control board 4 is configured to include, for example, a computer.

Specific examples of various sensors include a current sensor 31, a voltage sensor, a rotation angle sensor, and the like. The current sensor 31 detects a phase current flowing through the winding of each phase of the motor 3. One of the voltage sensors detects the voltage at a high potential side terminal of the filter capacitor 7a. One of the voltage sensors detects the voltage at a high potential side terminal of the smoothing capacitor 7b. The rotation angle sensor detects the rotation angle of the rotor of the motor 3.

The drive circuit unit generates a drive signal based on the drive command from the control board 4, and outputs the drive signal to the gate electrodes of the switching elements 5i and 6i of the corresponding semiconductor modules 5 and 6. As a result, the switching elements 5i and 6i are driven, that is, are driven on and off. In the present embodiment, a drive circuit unit is provided for each of the semiconductor modules 5 and 6.

Figure 2:
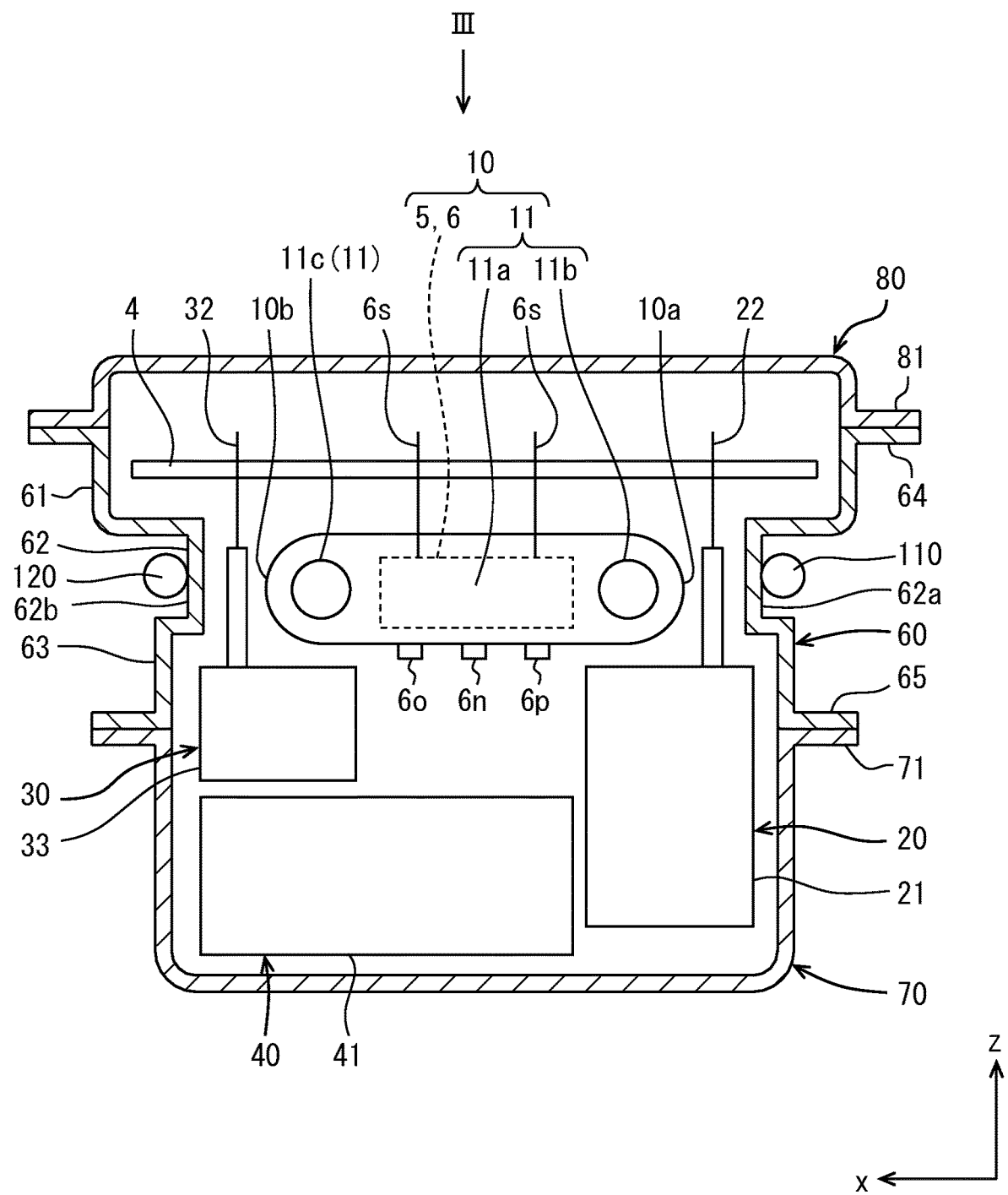
FIG. 2 is a cross-sectional view schematically showing a positional relationship of components of the power conversion device according to the first embodiment.
Figure 3:
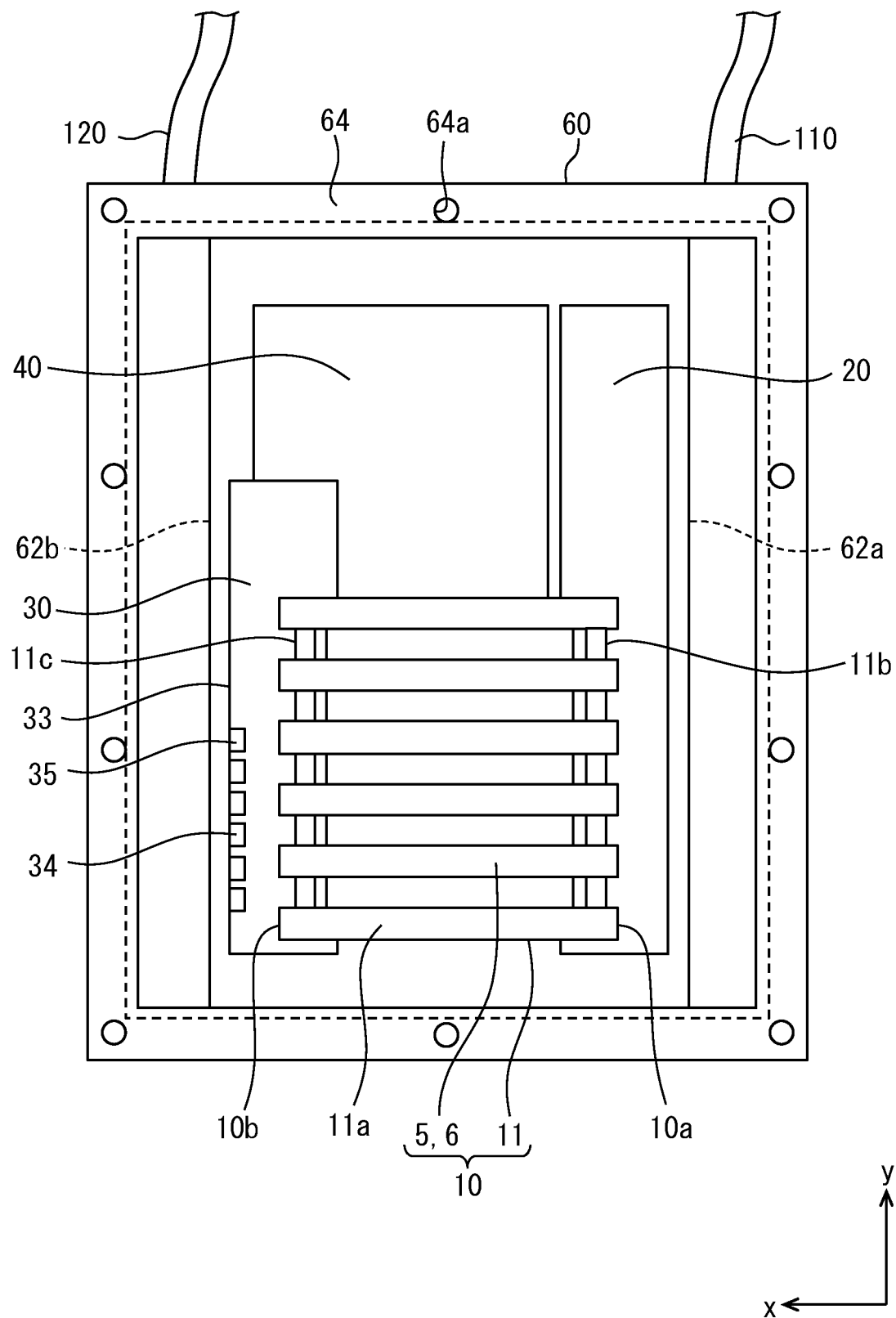
FIG. 3 is a view seen from an arrow III of FIG. 2 with a cover and a control board removed.
Figure 4:
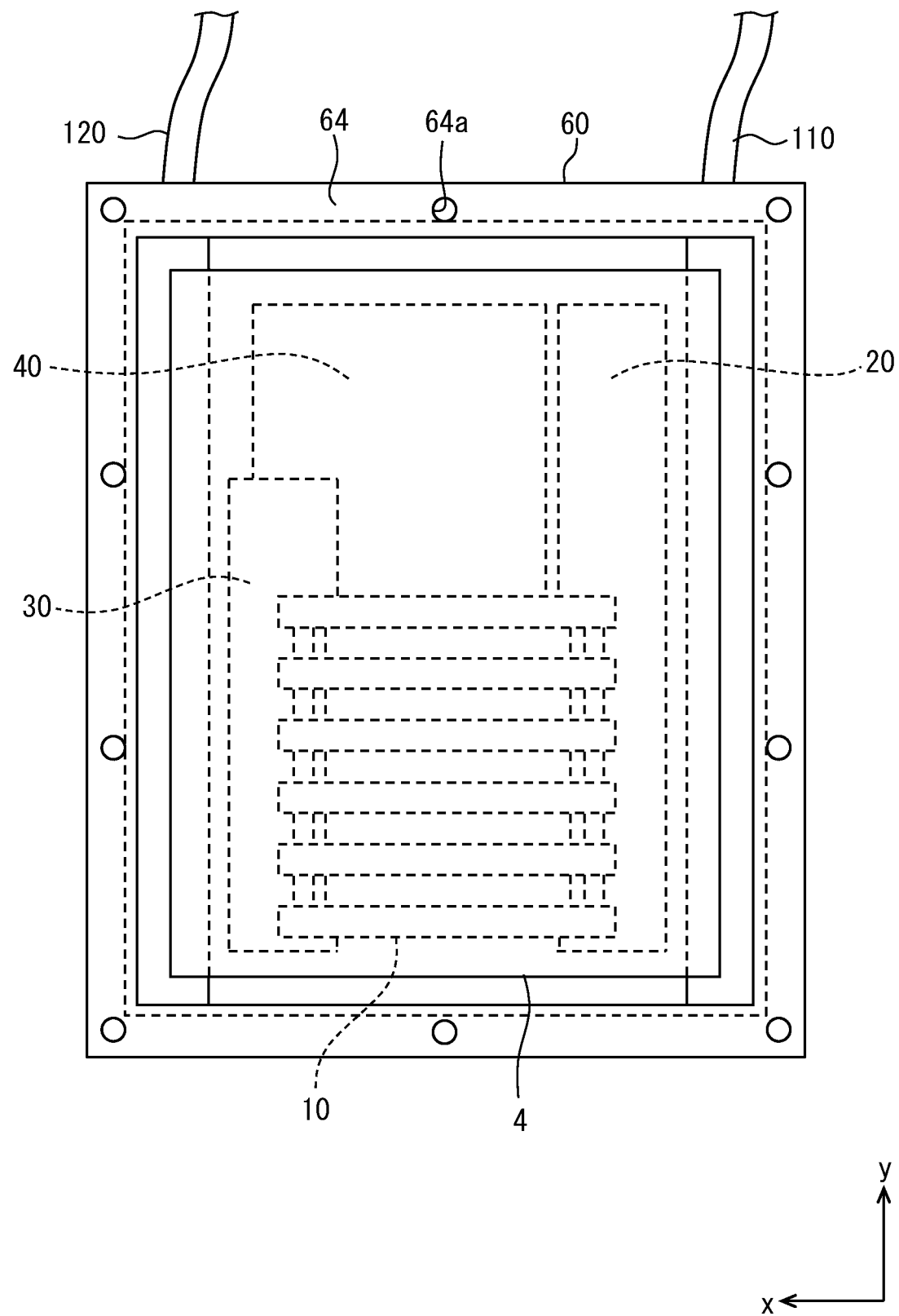
FIG. 4 is a top view showing a state in which a control board is attached to the power conversion device in the state shown in FIG. 3.

Next, the arrangement of the component parts of the power conversion device will be described with reference to FIGS. 2 to 4.

<Arrangement of Component Parts of Power Conversion Device>

The power conversion device 1 includes the control board 4, a semiconductor unit 10, a capacitor unit 20, a terminal unit 30, a reactor unit 40, and a case. The control board 4, the semiconductor unit 10, the capacitor unit 20, the terminal unit 30, and the reactor unit 40 are housed inside the case.

The case has a cover 80, an upper case 60 and a lower case 70. The cover 80, the upper case 60, and the lower case 70 are arranged side by side in a z direction. The case is made of metal and is molded by a die casting method using, for example, an aluminum-based material. The case is formed by fastening the cover 80, the upper case 60, and the lower case 70 with bolts (not shown).

Specifically, the upper case 60 has a tubular shape with both ends open. The cover 80 covers one opening of the upper case 60. The lower case 70 covers the other opening of the upper case 60. A flange 64 (upper flange) formed in the upper case 60 and a flange 81 formed in the cover 80 are fastened by bolts inserted into the bolt holes 64a. A flange 65 (lower flange) formed in the upper case 60 and a flange 71 formed in the lower case 70 are fastened with bolts.

These flanges 64, 65, 71, and 81 have a shape extending in an annular shape when viewed from the z direction. The entire annular flange 65 (lower flange) is located inside the annular flange 64 (upper flange) when viewed from the z direction. Specifically, an outer peripheral edge of the lower flange is located inside an outer peripheral edge of the upper flange. More preferably, the outer peripheral edge of the lower flange is located inside an inner peripheral edge of the upper flange.

The upper case 60 entirely accommodates the control board 4 and the semiconductor unit 10. Further, the upper case 60 accommodates a part of the capacitor unit 20 and a part of the terminal unit 30. The lower case 70 entirely accommodates the reactor unit 40. Further, the lower case 70 accommodates a part of the capacitor unit 20 and a part of the terminal unit 30.

The semiconductor unit 10 includes the above-mentioned semiconductor modules 5 and 6 and a cooler 11 for cooling the semiconductor modules 5 and 6. The cooler 11 has a heat exchange portion 11a, an inflow pipe 11b, and an outflow pipe 11c, and forms a part of a circulation path for circulating a liquid refrigerant. The heat exchange portion 11a communicates with the inflow pipe 11b and the outflow pipe 11c. The liquid refrigerant that has flowed in from the inflow pipe 11b flows into the heat exchange portion 11a. The liquid refrigerant that has flowed into the heat exchange portion 11a flows out to the outflow pipe 11c. The heat exchange portion 11a contacts the semiconductor modules 5 and 6 via an insulator having high thermal conductivity, and cools the semiconductor modules 5 and 6 whose temperature rises due to the heat generated by the switching elements 5i and 6i.

The plurality of semiconductor modules 5 and 6 are arranged side by side in the y direction in a laminated manner. The heat exchange portion 11a is arranged between the adjacent semiconductor modules 5 and 6. That is, the cooler 11 has a plurality of heat exchange portions 11a. The plurality of heat exchange portions 11a are alternately laminated with the semiconductor modules 5 and 6. The heat exchange portion 11a, the inflow pipe 11b, and the outflow pipe 11c are arranged side by side in a x direction. The inflow pipe 11b and the outflow pipe 11c are located on both sides of the heat exchange portion 11a when viewed from a y direction.

The main terminals 6p of the semiconductor modules 5 and 6 are connected to the emitter electrodes of the upper arms 5U and 6U. The main terminals 6p are connected to a high potential power line Hi by a bus bar. A main terminal 6n of the semiconductor module 6 is connected to the collector electrodes of the lower arms 5L and 6L. The main terminal 6n is connected to a low potential power line Lo by a bus bar. The signal terminals 6s of the semiconductor modules 5 and 6 are connected to the gate electrodes of the switching elements 5i and 6i. The signal terminal 6s is mounted on the control board 4.

The control board 4 and the semiconductor unit 10 are arranged side by side in the z direction. The semiconductor unit 10 is arranged at a position facing a plate surface of the control board 4. The control board 4 has a rectangular shape when viewed from the z direction. The entire semiconductor unit 10 is located inside the control board 4 when viewed from the z direction. In other words, the entire semiconductor unit 10 is located in the z-direction projection range of the control board 4.

The capacitor unit 20 includes the filter capacitor 7a, the smoothing capacitor 7b, a voltage sensor wiring 22, and a capacitor case 21. The filter capacitor 7a and the smoothing capacitor 7b are housed in the capacitor case 21. As these capacitors, a film capacitor in the shape of a wound film is used. The shape and number of capacitors are adjusted by adjusting the width of the film, the number of turns, and the quantity of film capacitors. Then, by adjusting the arrangement of these capacitors, the capacitor case 21 can be made into a desired shape.

The terminal unit 30 includes the above-mentioned current sensor 31, a current sensor wiring 32, a terminal block 33, relay output terminals 34 and 35, and a bus bar (conductive member). The current sensor 31 and the bus bar are held in the terminal block 33. The terminal block 33 is made of an electrically insulating resin.

One end of the bus bar is connected to the output terminal 6o of the semiconductor module 6. The output terminal 6o is connected to the emitter electrode of the IGBT of the upper arm 6U and the collector electrode of the IGBT of the lower arm 6L. The other end of the bus bar functions as relay output terminals 34 and 35.

The bus bar is provided for each of the three semiconductor modules 6. Each bus bar has a plurality of relay output terminals 34, 35 that branch off. The plurality of relay output terminals 34 and 35 are arranged side by side in a row in the y direction.

The terminal unit 30 according to the present embodiment has a first relay output terminal 34 for each of the three phases and a second relay output terminal 35 for each of the three phases. The three first relay output terminals 34 are electrically connected to each of the three-phase windings (not shown) of the motor 3. The three second relay output terminals 35 are electrically connected to the three-phase windings (not shown) of another electric motor.

Specific examples of other electric motors include a traveling motor and a power generation motor provided in a hybrid vehicle system. For example, the traveling motor is connected to the relay output terminal 34, and the power generation motor is connected to the relay output terminal 35.

The lower case 70 is formed with a terminal opening (not shown). The terminal unit 30 is arranged in the case so that the relay output terminals 34 and 35 are exposed from the terminal opening.

The terminal unit 30 and the capacitor unit 20 are arranged on the opposite side of the control board 4 with respect to the semiconductor unit 10. The terminal unit 30 and the capacitor unit 20 are arranged side by side in the direction along the plate surface of the control board 4. Specifically, the terminal unit 30 and the capacitor unit 20 are arranged side by side in the x direction.

The voltage sensor wiring 22 is a wiring that electrically connects the voltage sensor described above and the control board 4. The voltage sensor wiring 22 extends in the z direction so as to straddle the semiconductor unit 10. The current sensor wiring 32 is a wiring that electrically connects the current sensor 31 described above and the control board 4. The current sensor wiring 32 extends in the z direction so as to straddle the semiconductor unit 10.

The reactor unit 40 has a reactor 8 and a case 41. The reactor 8 is housed in the case 41. The reactor unit 40 is arranged on the opposite side of the control board 4 with respect to the semiconductor unit 10. More specifically, the reactor unit 40 is arranged on the opposite side of the control board 4 with respect to the terminal unit 30.

The x direction, y direction, and z direction described above are defined as follows. The z direction is a direction perpendicular to a plate surface of the control board 4. The x direction is the direction in which the terminal unit 30 and the capacitor unit 20 are lined up along the plate surface. The y direction is a direction perpendicular to the z direction and the x direction.

Of both ends of the semiconductor unit 10 in the x direction, one end is referred to as a first end 10a and the other end is referred to as a second end 10b. In the present embodiment, both ends of the heat exchange portion 11a in the x direction correspond to the first end 10a and the second end 10b.

A part of the terminal unit 30 is located outside the second end 10b in the x direction. A part of the capacitor unit 20 is located outside the first end 10a in the x direction.

The upper case 60 has a first accommodating portion 61, a second accommodating portion 62, and a third accommodating portion 63. The first accommodating portion 61 is a portion of the upper case 60 accommodating the control board 4. The second accommodating portion 62 is a portion of the upper case 60 accommodating the semiconductor unit 10. The third accommodating portion 63 is a portion of the upper case 60 accommodating the capacitor unit 20 and the terminal unit 30.

A first recess 62a having a shape recessed inside the upper case 60 when viewed from the y direction is formed in a portion of the upper case 60 facing the first end 10a. A first electrical wiring 110 shown in FIGS. 2 to 4 is arranged in the first recess 62a. The first recess 62a has a shape extending along a zy plane.

Since the first end 10a is an end of the heat exchange portion 11a arranged in a laminated manner, the plurality of first ends 10a are discretely distributed in the y direction. The first recess 62a has a portion extending in the y direction along the position where the first ends 10a are distributed. The entire first recess 62a is located between the capacitor unit 20 and the control board 4 in the z direction.

A second recess 62b having a shape recessed inside the upper case 60 when viewed from the y direction is formed in a portion of the upper case 60 facing the second end 10b. A second electrical wiring 120 shown in FIGS. 2 to 4 is arranged in the second recess 62b. The second recess 62b has a shape extending along the zy plane.

Since the second end 10b is an end portion of the heat exchange portion 11a arranged in a laminated manner, the plurality of second ends 10b are discretely distributed in the y direction. The second recess 62b has a portion extending in the y direction along the position where the second ends 10b are distributed. The entire second recess 62b is located between the terminal unit 30 and the control board 4 in the z direction.

A portion of the upper case 60 facing the first end 10a and a portion of the upper case 60 facing the second end 10b correspond to the above-mentioned second accommodating portion 62. Since the second accommodating portion 62 is recessed inward by the first recess 62a and the second recess 62b, a cross-sectional area of the second accommodating portion 62 in a xy plane is smaller than a cross-sectional area of the first accommodating portion 61. Similarly, the cross-sectional area of the second accommodating portion 62 in the xy plane is smaller than a cross-sectional area of the third accommodating portion 63 in the xy plane.

The first electrical wiring 110 includes a wiring, a terminal connection portion, and a bracket. The first electrical wiring 110 is attached to the upper case 60 by the bracket. For example, the first electrical wiring 110 is wiring for supplying the DC power supply 2 to the power conversion device 1 (see FIG. 1).

The second electrical wiring 120 has a wiring, a terminal connection portion, and a bracket. The second electrical wiring 120 is attached to the upper case 60 by the bracket. For example, the second electrical wiring 120 is connected to the output terminal of the converter circuit by the semiconductor module 5 and is a wiring for supplying boosted electric power to a motor of an in-vehicle auxiliary machine.

<Operation and Effects>

As described above, according to the power conversion device 1, the terminal unit 30 and the capacitor unit 20 are arranged on the opposite side of the control board with respect to the semiconductor unit 10. Then, in the x direction, both ends 10a and 10b of the semiconductor unit 10 are located inside the capacitor unit 20 and the terminal unit 30. Therefore, according to the case in which the recesses 62a and 62b are formed in the portion facing the first end 10a located inside, a space factor in the case can be increased. Nevertheless, since the electrical wirings 110 and 120 are arranged in the recesses 62a and 62b, the vehicle mounting space in which the electrical wirings 110 and 120 are added to the power conversion device 1 can be sufficiently reduced, and effective utilization of in-vehicle space can be promoted.

In short, the terminal unit 30 and the capacitor unit 20 are arranged on the opposite side of the control board with respect to the semiconductor unit 10. Therefore, the body size of the power conversion device 1 in the x direction can be reduced as compared with the case where the terminal unit and the capacitor unit are arranged side by side with the semiconductor unit 10 in the x direction. Nevertheless, recesses 62a and 62b are formed in the case according to the unevenness of the semiconductor unit 10, the terminal unit 30, and the capacitor unit 20. Therefore, the space factor in the case can be increased. Moreover, since the electrical wirings 110 and 120 are arranged in such recesses 62a and 62b, the vehicle mounting space in which the electrical wirings 110 and 120 are added to the power conversion device 1 can be sufficiently reduced.

Further, in the present embodiment, the case has the cover 80, the upper case 60 and the lower case 70 arranged in the z direction. The recesses 62a and 62b are formed in the upper case 60. The upper case 60 is formed with a flange 64 (upper flange) fastened to the cover 80 and the flange 65 (lower flange) fastened to the lower case 70. The entire flange 65 (lower flange) is located inside the flange 64 (upper flange) when viewed from the z direction.

According to this configuration, when the power conversion device 1 is mounted on the vehicle so that the z direction is the vertical direction and the cover 80 is on the upper side, the following effects are obtained. That is, even when water such as washing water at the time of car washing falls vigorously from above the power conversion device 1, it becomes difficult for the washing water to fall on the lower flange. Therefore, it is possible to reduce the risk of water entering the case from the fastening surface between the upper case 60 and the lower case 70.

Further, in the present embodiment, the entire capacitor unit 20 and the terminal unit 30 are located inside the peripheral edge of the control board 4 when viewed from the z direction. According to this configuration, when the shape of the case is set according to the shape of each unit to increase the space factor in the case, the lower flange is likely to be located inside the upper flange. Therefore, it is possible to achieve both the above-mentioned suppression of water intrusion and an increase in the space factor.

Further, in the present embodiment, the semiconductor unit 10 has a plurality of semiconductor modules 5 and 6. The plurality of semiconductor modules 5 and 6 are arranged side by side in the y direction in a laminated manner. According to this configuration, if the shape of the case is set according to the shape of the semiconductor unit 10 to increase the space factor in the case, the recesses 62a and 62b are likely to have a shape extending in the y direction. Therefore, it is possible to make it easy to arrange the electrical wirings 110 and 120 in a certain direction (y direction) and to increase the space factor.

Further, in the present embodiment, recesses 62a and 62b are formed on both sides of the case. Therefore, it is possible to promote the effect of improving the space factor in the case and making it possible to arrange the electrical wirings 110 and 120 in the recesses 62a and 62b.

OTHER EMBODIMENTS

The disclosure in this specification and drawings is not limited to the exemplified embodiments. The disclosure encompasses the illustrated embodiments and modifications by those skilled in the art based thereon. For example, the disclosure is not limited to the combinations of parts and/or elements shown in the embodiments. The disclosure may be implemented in various combinations. The disclosure may have additional parts that may be added to the embodiments. The disclosure covers omissions of parts and/or elements of the embodiments. The disclosure covers replacement or combination of components, elements between one of the embodiments and another.

In the first embodiment, a part of the capacitor unit 20 or of the terminal unit 30 is located outside the semiconductor unit 10 when viewed from the z direction. On the other hand, the entire capacitor unit 20 or the entire terminal unit 30 may be located outside the semiconductor unit 10 when viewed from the z direction.

In the first embodiment, the entire lower flange is located inside the upper flange when viewed from the z direction. On the other hand, a part of the lower flange may be located inside the upper flange when viewed from the z direction. Alternatively, all or part of the lower flange may be located outside the upper flange when viewed from the z direction.

In the first embodiment, the portion of the case excluding the cover 80 is divided into two in the z direction by the upper case 60 and the lower case 70. On the other hand, it may be divided in the x direction or the y direction. Alternatively, the upper case 60 and the lower case 70 may be integrally formed in a non-divided manner.

In the first embodiment, the entire capacitor unit 20 and terminal unit 30 are located inside a peripheral edge of the control board 4 when viewed from the z direction. On the other hand, a part of the capacitor unit 20 or the terminal unit 30 may be located outside the peripheral edge of the control board 4 when viewed from the z direction.

In the first embodiment, the plurality of semiconductor modules 5 and 6 are arranged side by side in the y direction in a laminated manner. On the other hand, the plurality of semiconductor modules 5 and 6 may be arranged in a laminated manner in the x direction. In short, the stacking direction of the semiconductor modules 5 and 6 and the direction in which the capacitor unit 20 and the terminal unit 30 are arranged may be orthogonal or parallel.

In the first embodiment, recesses 62a and 62b are formed on both sides of the case. On the other hand, the first recess 62a or the second recess 62b may be formed on one side of the case.

What is claimed is:

1. A power conversion device that converts electric power supplied to a vehicle-mounted motor by an upper and lower arm circuit, the power conversion device comprising:
   a semiconductor unit having a semiconductor module in which switching elements of upper and lower arm circuits are resin-sealed, and a cooler configured to cool the semiconductor module;
   a terminal unit having an output terminal of the semiconductor module, a relay output terminal configured to electrically connect windings of the vehicle-mounted motor, and a terminal block configured to hold the relay output terminal;
   a capacitor unit having a smoothing capacitor connected in parallel to the upper and lower arm circuits to smooth a voltage pulsation, and a capacitor case accommodating the smoothing capacitor;
   a control board configured to control an operation of the switching elements; and
   a case in which the control board, the semiconductor unit, the terminal unit, and the capacitor unit are housed,
   wherein
   the semiconductor unit is arranged at a position facing a plate surface of the control board,
   the terminal unit and the capacitor unit are arranged side by side in a direction along the plate surface on an opposite side of the control board with respect to the semiconductor unit,
   a direction perpendicular to the plate surface of the control board is referred to as a z direction, a direction in which the terminal unit and the capacitor unit are arranged side by side is referred to as a x direction, and a direction perpendicular to the z direction and the x direction is referred to as a y direction,
   of both ends of the semiconductor unit in the x direction, one end is referred to as a first end and the other end is referred to as a second end, at least a part of the capacitor unit or the terminal unit is located outside the first end in the x direction, and a recess in which an electrical wiring is arranged is formed in a portion of the case facing the first end so as to be recessed inside the case.

2. The power conversion device according to claim 1, wherein the case has a cover, an upper case and a lower case arranged in the z direction, the recess is formed in the upper case, the upper case is formed with an upper flange to be fastened to the cover and a lower flange to be fastened to the lower case, and the entire lower flange is located inside the upper flange when viewed from the z direction.

3. The power conversion device according to claim 1, wherein the entire capacitor unit and the entire terminal unit are located inside a peripheral edge of the control board when viewed from the z direction.

4. The power conversion device according to claim 1, wherein the semiconductor unit has a plurality of semiconductor modules, and the plurality of semiconductor modules are arranged side by side in the y direction in a laminated manner.

5. The power conversion device according to claim 1, wherein the recess is referred to as a first recess, the electrical wiring is referred to as a first electrical wiring, at least a part of the terminal unit is located outside the first end in the x direction, at least a part of the capacitor unit is located outside the second end in the x direction, and a second recess in which a second electrical wiring is arranged is formed in a portion of the case facing the second end so as to be recessed inside the case.

* * * * *